United States Patent
Allen et al.

(10) Patent No.: US 11,674,985 B2
(45) Date of Patent: *Jun. 13, 2023

(54) ELECTRICAL SAFETY MONITORING SYSTEM UTILIZING A HEARTBEAT SIGNAL INDICATIVE OF VOLTAGE PRESENT ON LINE INPUTS

(71) Applicant: Grace Technologies, Inc., Davenport, IA (US)

(72) Inventors: Philip Brown Allen, Davenport, IA (US); Mark Alan Hockert, Davenport, IA (US)

(73) Assignee: GRACE TECHNOLOGIES, INC, Davenport, IA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/410,503

(22) Filed: Aug. 24, 2021

(65) Prior Publication Data

US 2021/0382093 A1 Dec. 9, 2021

Related U.S. Application Data

(63) Continuation of application No. 16/191,229, filed on Nov. 14, 2018, now Pat. No. 11,150,277.

(60) Provisional application No. 62/585,891, filed on Nov. 14, 2017.

(51) Int. Cl.
   *G01R 19/155* (2006.01)
   *G01R 19/25* (2006.01)

(52) U.S. Cl.
   CPC ....... *G01R 19/155* (2013.01); *G01R 19/2513* (2013.01)

(58) Field of Classification Search
   CPC .......................... G01R 19/155; G01R 19/2513
   See application file for complete search history.

(56) References Cited

U.S. PATENT DOCUMENTS

| | | | |
|---|---|---|---|
| 5,631,629 A | 5/1997 | Fooks et al. | |
| 6,703,938 B1 | 3/2004 | Clarke | |
| 9,921,260 B2 | 3/2018 | Bugaris et al. | |
| 10,001,513 B2 | 6/2018 | Parker et al. | |
| 10,468,208 B2 | 11/2019 | Ramirez | |
| 2009/0055031 A1 | 2/2009 | Slota et al. | |

(Continued)

OTHER PUBLICATIONS

R-3W / R-3W-SR Thru-Door Voltage Indicator, Grace Engineered Products, Inc. 2014, 2 pages.

*Primary Examiner* — Lee E Rodak
(74) *Attorney, Agent, or Firm* — Goodhue, Coleman & Owens, P.C.

(57) ABSTRACT

An electrical safety monitoring system is provided. The system includes an analog circuit having line inputs for hardwiring an L1, an L2, an L3, and a GND three-phase connections, the analog circuit configured to monitor if voltage exists between any two of the line inputs, a heartbeat circuit electrically connected to the analog circuit to provide a heartbeat signal indicative of voltage present on any of the line inputs, an isolated voltage source electrically connected to the heartbeat circuit to power the heartbeat circuit with a VDC+ and a VDC−, and a logic circuit in operative communication with the heartbeat circuit for monitoring input from the heartbeat circuit and decoding the input from the heart beat circuit. The isolated voltage source may be supplied by a programmable logic controller (PLC) and the logic circuit may be implemented within the same PLC as a function block.

18 Claims, 4 Drawing Sheets

(56) References Cited

U.S. PATENT DOCUMENTS

| | | |
|---|---|---|
| 2009/0240380 A1 | 9/2009 | Shah et al. |
| 2011/0273302 A1 | 11/2011 | Fornage et al. |
| 2013/0030734 A1 | 1/2013 | Ware |
| 2013/0214922 A1 | 8/2013 | Clarke |
| 2014/0002169 A1 | 1/2014 | Ramirez |
| 2018/0106851 A1 | 4/2018 | Schweitzer, III et al. |

ELECTRICAL SAFETY MONITORING SYSTEM UTILIZING A HEARTBEAT SIGNAL INDICATIVE OF VOLTAGE PRESENT ON LINE INPUTS

PRIORITY STATEMENT

This application is a continuation of U.S. Non-provisional patent application Ser. No. 16/191,229 filed on Nov. 14, 2018, which claims priority to U.S. Provisional Patent Application No. 62/585,891 filed on Nov. 14, 2017, which is hereby incorporated by reference in its entirety.

FIELD OF THE INVENTION

The present invention relates to electrical safety devices. More particularly, but not exclusively, the present invention relates to interfacing with an analog circuit for voltage monitoring and conveying state information in a safe and effective manner.

BACKGROUND

The present invention relates to electrical safety, and more particularly to monitoring of AC voltages using voltage indicators. A voltage indicator is generally a low cost device that pre-verifies electrical isolation before maintenance personnel open a control panel and risk exposure to hazardous voltages. Typically mounted to the panel exterior and hardwired into the load side of the main disconnect, this device provides electrical maintenance with an additional safety valve. Easy to apply, low cost, quick installation, and inherent reliability makes a voltage indicator a very effective electrical safety device.

Creating and insuring an electrically safe work condition is critical for electricians performing maintenance on de-energized systems. The presence of voltage is the only determining factor if an electrical accident or an arc flash can possibly occur—No voltage, No accident, No arc flash. "Voltage or no voltage" is also the basis of the NFPA 70E's (National Fire Protection Association Standard's for Electrical Safety Requirements for Employee Workplaces) two primary themes: a) establishing an electrically safe work condition, and b) achieving safety while working on energized systems. A voltage warning indicator is like a 'hard wired voltmeter' with the advantage that it needs no power supply or batteries because it is powered from the same 'voltage' that it indicates. A voltage indicator is an additional safety measure between maintenance personnel and hazardous voltage.

One example of an electrical safety device is a thru-door voltage indicator such as the R-3W thru-door voltage indicate from Grace Engineered Products, Inc. of Davenport, Iowa. Such a device provides electrical safety information while the panel doors are safely closed. In particular, an individual can view the voltage indicator from outside the enclosure and while the panel door is closed. Such a device may detect 3-phase AC or DC voltage such as from 40-750 VAC and 30-1000 VDC. This is a significant range. Such a device is an analog circuit. The analog circuit being used may be of the type disclosed in U.S. Pat. No. 6,703,938 to Clarke, hereby incorporated by reference in its entirety.

Despite the advantages of such a device, problems remain. In particular, it would be advantageous if such an analog based design could be interfaced in a safe and effective manner with other circuitry, then state information could be used in additional lock-out tag-out procedures, could be remotely monitored, or other benefits could be obtained. However, there are issues with interfacing such a circuit with other devices. In particular, the interface should not have any adverse effect on the operation of the monitoring circuit. In addition, such an analog circuit has high impedance and a limited ability to create useful energy. Moreover, the interfacing circuit needs to result in accurate conveyance of the presence or absence of voltage and its presence introduces another failure point and so provision must be made for situations where the interfacing circuit itself fails.

SUMMARY

Therefore, it is a primary object, feature, or advantage of the present invention to improve over the state of the art.

It is a further object, feature, or advantage of the present invention to interface with an analog circuit of an electrical safety device.

It is a still further object, feature, or advantage of the present invention to communicate state of line inputs from an electrical safety device.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by an objects, features, or advantages stated herein.

According to one aspect, an electrical safety monitoring system is provided. The system includes an analog circuit having line inputs for hardwiring an L1, an L2, an L3, and a GND three-phase connections, the analog circuit configured to monitor if voltage exists between any two of the line inputs, a heartbeat circuit electrically connected to the analog circuit to provide a heartbeat signal indicative of voltage present on any of the line inputs, an isolated voltage source electrically connected to the heartbeat circuit to power the heartbeat circuit with a VDC+ and a VDC−, and a logic circuit in operative communication with the heartbeat circuit for monitoring input from the heartbeat circuit and decoding the input from the heart beat circuit. The isolated voltage source may be supplied by a programmable logic controller (PLC) and the logic circuit may be implemented within the same PLC as a function block. The heartbeat signal may take on any number of forms such as where information for the line inputs is represented through duty cycle.

According to another aspect, a method of electrical safety monitoring is provided. The method includes monitoring an L1, an L2, an L3, and a GND three-phase connections with an analog circuit, the analog circuit configured to monitor if voltage exists between any two of the line inputs, generating at heartbeat signal indicative of voltage present on any of the line inputs, and monitoring the heartbeat signal and decoding the heartbeat signal to provide status of the three-phase connections.

According to another aspect, a method of electrical safety monitoring includes monitoring line inputs consisting of an L1, an L2, an L3, and a GND three-phase connections with an analog circuit, the analog circuit configured to monitor if voltage exists between any two of the line inputs. The method further includes generating at heartbeat signal indicative of voltage present on any of the line inputs using a heartbeat circuit, wherein the heartbeat circuit is electrically connected to an isolated voltage source to power the heartbeat circuit with a VDC+ and a VDC−. The method further includes monitoring the heartbeat signal and decoding the heartbeat signal to provide status of the three-phase connections and detect interruptions between the isolated voltage source and the heartbeat circuit. The heartbeat circuit may be electrically connected to an isolated voltage source to power the heartbeat circuit with a VDC+ and a VDC−. The heartbeat signal varies in duty cycle based on whether or not voltage is detected at any of the line inputs. The heartbeat signal may vary in amplitude based on amplitude of voltage detected at any of the line inputs and varies in duty cycle based on whether or not voltage is detected at any of the line inputs.

BRIEF DESCRIPTION OF THE DRAWINGS

Illustrated embodiments of the disclosure are described in detail below with reference to the attached drawing figures, which are incorporated by reference herein.

DETAILED DESCRIPTION

Figure 4:
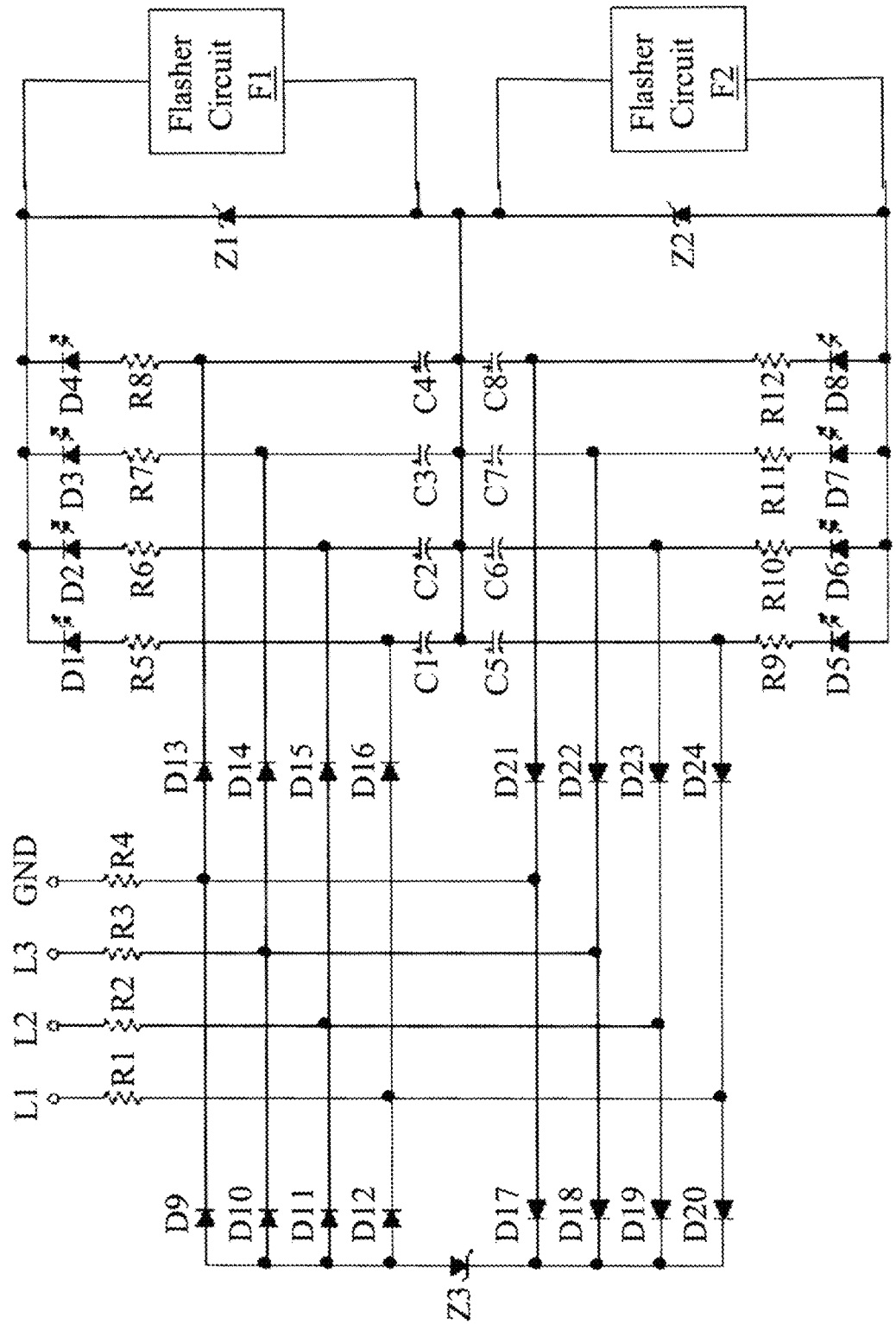
FIG. 4 illustrates one example of an analog circuit.

One example of an electrical safety device is a thru-door voltage indicator such as the R-3W thru-door voltage indicate from Grace Engineered Products, Inc. of Davenport, Iowa. Such a device provides electrical safety information while the panel doors are safely closed. In particular, an individual can view the voltage indicator from outside the enclosure and while the panel door is closed. Such a device may detect 3-phase alternating current (AC) or direct current (DC) voltage such as from 40-750 VAC and 30-1000 VDC. This is a significant range. Such a device is an analog circuit, but there is a need to interface such a circuit to other devices. The analog circuit being used may be of the type disclosed in U.S. Pat. No. 6,703,938 to Clarke, hereby incorporated by reference in its entirety. Such an analog circuit may of the type shown in FIG. 4. The present invention provides interfacing such an analog-based design in a safe and effective manner, so as to generate state information which may be used in additional lock-out tag-out procedures, may be remotely monitored, or other creates benefits. It should be appreciated that any benefits provided by the features of the invention described herein may be significant and substantial in improving electrical safety and thus highly desirable.

Figure 1:
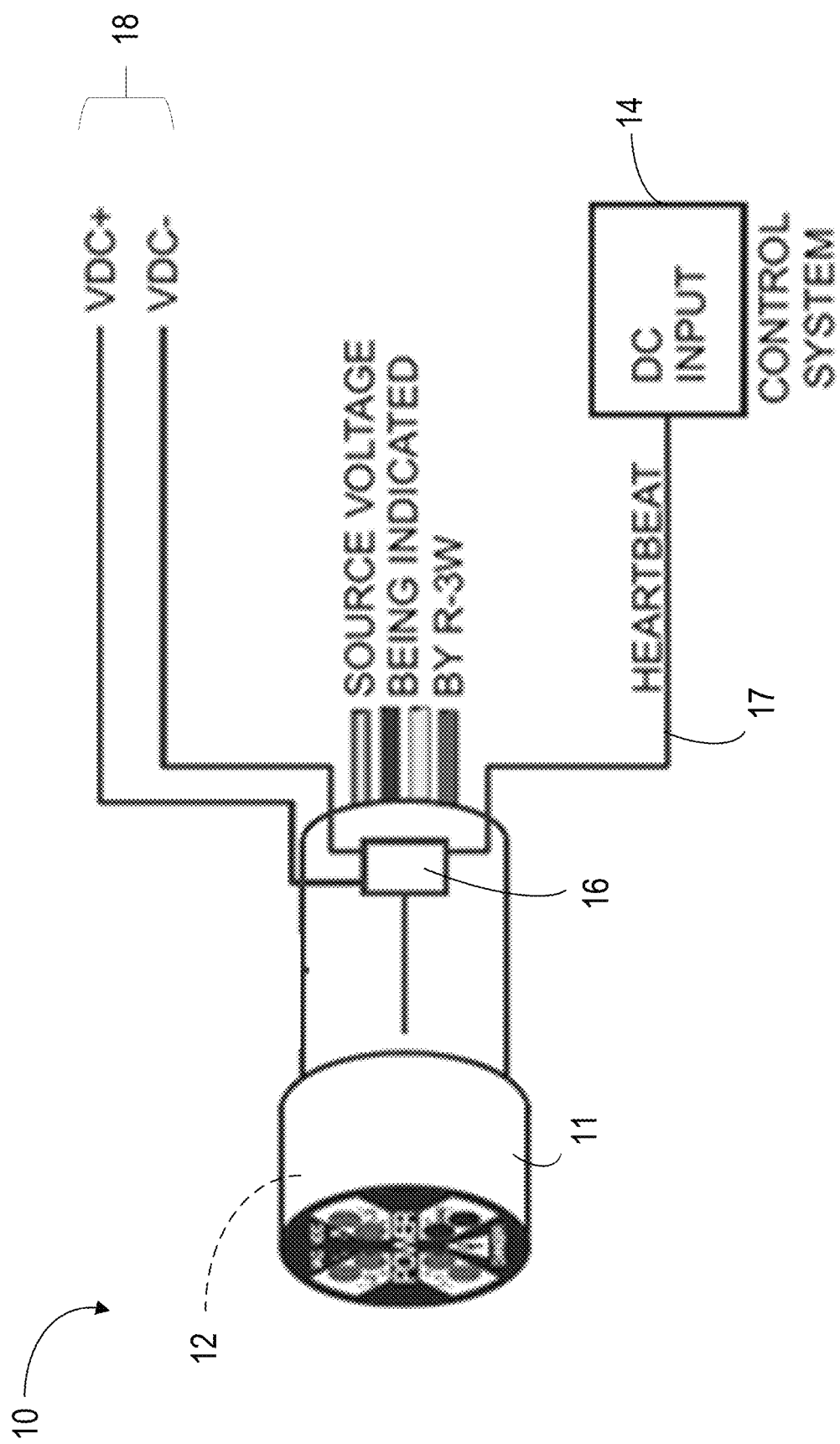
FIG. 1 illustrates one example of an electrical safety monitoring system.

FIG. 1 illustrates one example of an electrical safety monitoring system 10 with a housing 11. The system 10 includes an analog circuit 12 having line inputs for hardwiring an L1, L2, L3, and a GND three-phase connection. The analog circuit is configured to monitor if voltage exits between any two of the line inputs. A heartbeat circuit 16 is electrically connected to the analog circuit to provide a heartbeat signal 17 indicative of voltage present on any of the line inputs. An isolated voltage source 18 is electrically connected to the heartbeat circuit 16 to power the heartbeat circuit 16. A logic circuit 14 such as may be associated with a control system is operatively connected to the heartbeat circuit 16 for monitoring input from the heartbeat circuit 16 and decoding the input from the heartbeat circuit.

The heartbeat signal may be of any number of different types of signal. For example, if there is voltage detected the signal may be set to VDC+ for half of a cycle and to VDC− for half of a cycle. Thus, where x is the total cycle time of the heartbeat signal, the signal is set to VDC+ for x/2 time and set to VDC− for x/2 time. If there is an absence of voltage then the signal may be set to a different value. For example, if there is absence of voltage then the signal may be set to VDC+ for a quarter of a cycle and VDC− for a quarter of a cycle. Thus, where x is the total cycle time of the heartbeat signal, then signal may be set to VDC+ for x/4 and set to VDC− for (3*x)/4. Thus, the duty cycle of the heartbeat signal may be used to encode state information for the line inputs being monitored.

The heartbeat signal may also vary by voltage. For example, the heartbeat signal may be set to VDC+ for x/(y*2) time and set to VDC− for x/(y*2). Here, x would be the total cycle time of the heartbeat signal whereas y would vary based on the voltage level that the analog circuit detects. The higher the voltage the larger y would be. For example, y could vary between 1 and 100. This would allow a range that the receiving device would be able to detect if the voltage is towards the lower range, the middle range, or the upper range. The lower the voltage the lower y would be. If there is an absence of voltage then the signal may be set to VDC+ for x/4 and set to VDC− for (3*x)/4. Thus, varying the voltage or amplitude may be performed in order to encode information about the line inputs. Of course, it is to be understood that any number of other schemes may be used in order to convey the presence of voltage, the absence of voltage, and/or the magnitude of voltage detected.

The heartbeat circuit 16 used is based upon the manner desired for representing the presence or absence of voltage and/or the magnitude of voltage. The heartbeat circuit may include a timer circuit, an oscillator circuit, or other types of circuits to vary cycling and/or amplitude.

If the VDC voltage from the voltage source 18 was interrupted to the analog heartbeat circuit 16 such as due to a broken wire or connection, this would be detected because the heartbeat signal would not go high (to VDC+). Similarly, if the VDC-wire or connection was broken, the heartbeat signal would not go low (to VDC−). Thus, if there is a broken wire or connection, this may be determined from the heartbeat signal.

Figure 2:
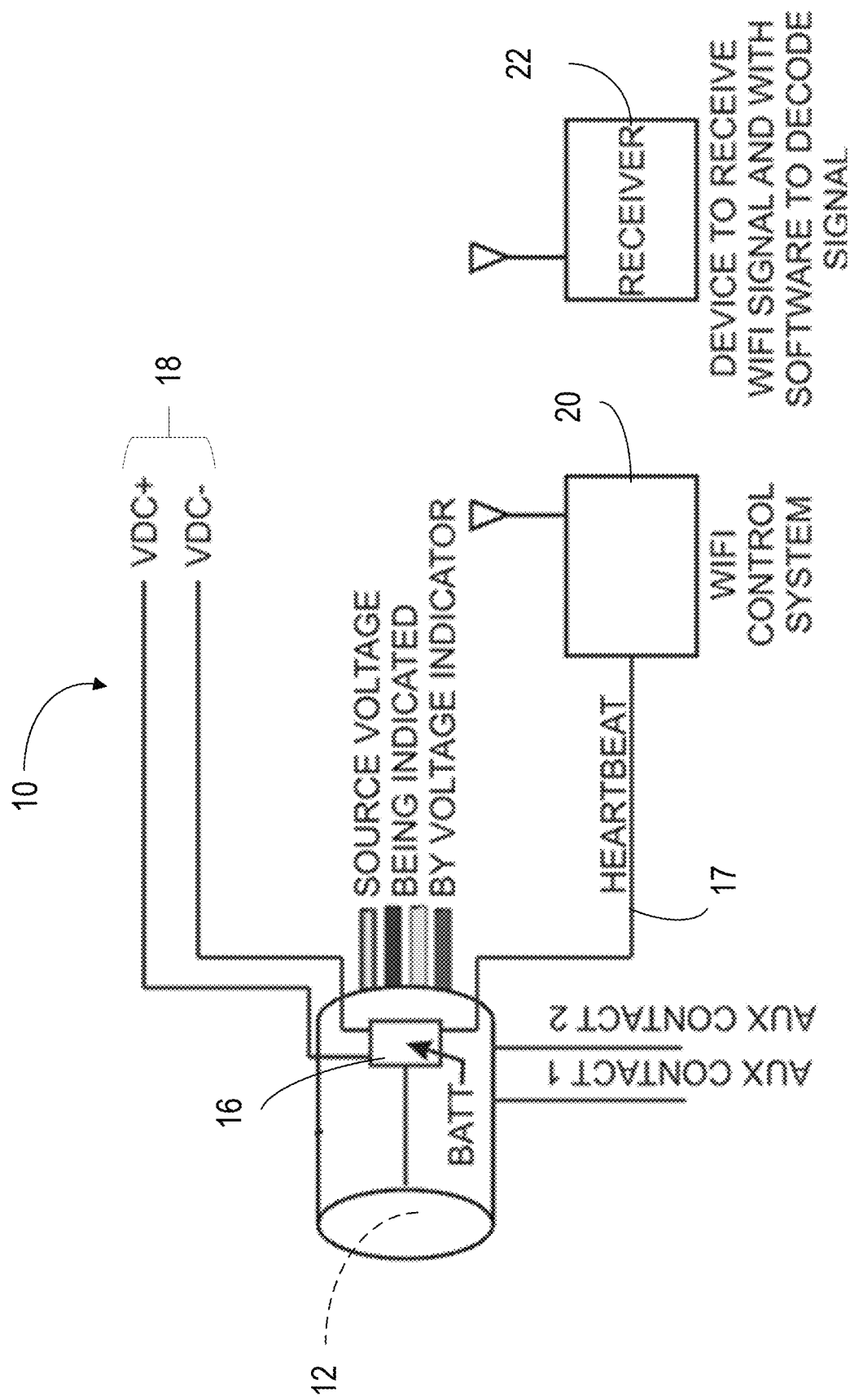
FIG. 2 illustrates another example of an electrical safety monitoring system where a wireless transceiver is used.

FIG. 2 illustrates an alternative embodiment. In FIG. 2 the heartbeat signal may be communicated to a wireless transceiver 20. The wireless transceiver 20 may then generate a wireless signal to communicate the heartbeat signal indicative of the status of voltage. The wireless transceiver 20 may be a wireless radio transceiver of any of a number of different types of wireless radio transceivers. This may include Wi-Fi, Zigbee, Bluetooth, Bluetooth Low Energy (BLE), Z-Wave, or other type of wireless connection. Another receiver or transceiver 20 may be used to receive the heartbeat signal. Instead of having the heartbeat signal decoded at the transceiver 20, the heartbeat signal may be decoded at the receiver or transceiver 22.

Note that in FIG. 2, the VDC+ and VDC− connections to a voltage source such as a PLC are still present. These connections may be used to determine that the voltage source or PLC is still connected to the analog circuit 12 and if the voltage source or PLC is not connected to the analog circuit 12 of the voltage indicator, the analog circuit may signal that it lost the voltage connections through the wireless connection. The analog circuit may monitor the voltage in the manner previously described, however, instead of sending the status over wires back to a PLC, it may send the heartbeat signal over the wireless connection. The heartbeat signal may go back to the device that is receiving the wireless connection. The device may be a smartphone, tablet, computer, or other type of computing device. Software operating on the device may receive the heartbeat signal and determine the state of the voltage indicator from the signal. These states may include voltage unsafe, absence of voltage, loss of power from the PLC, and other states. If a switch is present as will be discussed, the state of the switch as being open or closed may also be included. In addition, transitions associated with the switch may be communicated. For example, if the switch just opened the device could determine that there should be an absence of voltage and indicate whether or not that condition occurred as expected. If not, it could indicate an error state. The device may also indicate a safe state if the switch opened and there is an absence of voltage. The wireless communication protocol may be defined to send redundant communication messages for each critical signal. The redundant messages may be checked and if found to be valid, then an interpretation of the signal may be displayed on the device. If the redundant messages are found to be invalid, then the device may show an error or else ignore the message. It should be understood that the interpretation of the signal performed by the device may be performed using software and may be configured differently for different applications.

Figure 3:
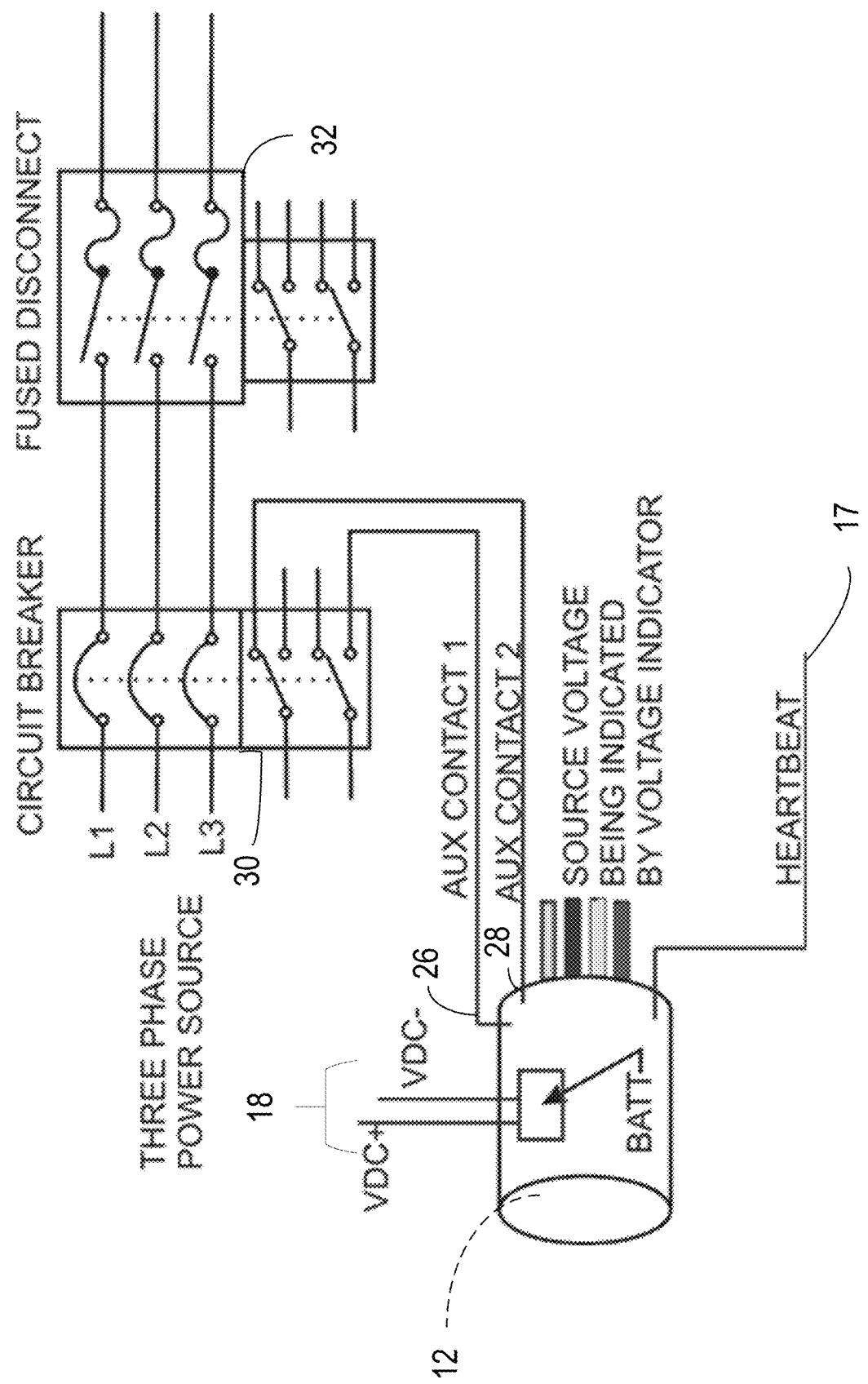
FIG. 3 illustrates another example of an electrical safety monitoring system where a switch is used.

FIG. 3 illustrates another implementation where a separate voltage 18 from a PLC or otherwise may pass through auxiliary contacts 26, 28 of a disconnect switch 32 and/or circuit breaker 30 (hereinafter "switch"). This allows for an indication to the analog circuit 12 that the switch has opened. There may be two auxiliary contacts for redundancy. Each contact may go to a separate input on the analog circuit 14 for the voltage indicator. One contact may be normally open and the other contact may be normally closed. This allows the analog circuitry 12 of the voltage indicator to determine if the switch just opened or just closed. This also allows the voltage indicator to detect if there was a failure in one of the contacts as both contacts cannot be in the same state. This failure may be further reflected by the heartbeat signal 17 being sent. The voltage indicator may then create the signal in the manner previously described.

The invention is not to be limited to the particular embodiments described herein. In particular, the invention contemplates numerous variations in the analog circuit, the heartbeat circuit, the logic circuit, the manner in which the state of the line inputs is conveyed, and numerous other variations. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes or methods of the invention. It is understood that any other modifications, substitutions, and/or additions can be made, which are within the intended spirit and scope of the invention.

What is claimed is:

1. An electrical safety monitoring system comprising:
a housing;
a plurality of visual indicators operatively connected to the housing;
an analog circuit disposed within the housing and having line inputs for hardwiring a first line (L1), a second line (L2), a third line (L3), and a ground (GND), wherein each of the line inputs is a three-phase connection, wherein the analog circuit is configured to monitor if voltage exists between any two of the line inputs and further configured to visually indicate presence of voltage on each of the line inputs using the plurality of visual indicators operatively connected to the housing;
a heartbeat circuit electrically connected to the analog circuit to provide a heartbeat signal indicative of voltage present on any of the line inputs, the heartbeat signal encoding state information for each of the line inputs for the first line (L1), the second line (L2), the third line (L3) and the ground (GND);
an isolated voltage source electrically connected to the heartbeat circuit to power the heartbeat circuit with a VDC+ and a VDC−;
a logic circuit in operative communication with the heartbeat circuit for monitoring input from the heartbeat circuit and decoding the input from the heartbeat circuit to determine state information for each of the line inputs for the first line (L1), the second line (L2), the third line (L3) and the ground (GND).

2. The system of claim 1 wherein the isolated voltage source is supplied by a programmable logic circuit (PLC) and wherein the logic circuit is implemented by the programmable logic circuit (PLC).

3. The system of claim 1 wherein the heartbeat signal is set to the VDC+ for a first portion of a cycle and to the VDC− for a second portion of the cycle if there is voltage detected at any of the line inputs according to a first ratio which represents a ratio of the first portion to the second portion.

4. The system of claim 1 wherein the heartbeat signal is set to the VDC+ for x/2 time and set to the VDC− for x/2 time, wherein x is defined as a total cycle time of the heartbeat signal.

5. The system of claim 1 wherein the heartbeat signal varies in duty cycle based on whether or not voltage is detected at any of the line inputs.

6. The system of claim 1 wherein the heartbeat signal varies in amplitude based on amplitude of voltage detected at any of the line inputs and varies in duty cycle based on voltage detected at the line inputs.

7. The system of claim 1 wherein the heartbeat signal does not go high if a connection to the VDC+ is broken.

8. The system of claim 1 wherein the heartbeat signal does not go low if a connection to the VDC− is broken.

9. The system of claim 1 further comprising a wireless transceiver electrically connected to the heartbeat circuit for receiving the heartbeat signal and wherein the logic circuit is located remotely from the heartbeat circuit.

10. The system of claim 9 wherein the wireless transceiver is selected from a set comprising a Wi-Fi transceiver, a Bluetooth transceiver, a Z-wave transceiver, and a ZigBee transceiver.

11. The system of claim 10 wherein the logic circuit is implemented at least partially in software at a remote computing device.

12. The system of claim 1 further comprising a switch operatively connected to the analog circuit.

13. The system of claim 12 wherein the switch is operatively connected to the analog circuit through a first auxiliary contact and a second auxiliary contact to provide for redundancy.

14. The system of claim 13 wherein the analog circuit provides for determining if the switch just opened or just closed.

15. An electrical safety monitoring system comprising:
a housing;
an analog circuit disposed within the housing, the analog circuit having line inputs for hardwiring a first line (L1), a second line (L2), a third line (L3), and a ground (GND), wherein each of the line inputs is a three-phase connection, wherein the analog circuit is configured to monitor if voltage exists between any two of the line inputs;

a heartbeat circuit electrically connected to the analog circuit to provide a heartbeat signal indicative of voltage present on any of the line inputs;

an isolated voltage source electrically connected to the heartbeat circuit to power the heartbeat circuit with a VDC+ and a VDC−;

a logic circuit in operative communication with the heartbeat circuit for monitoring input from the heartbeat circuit and decoding the input from the heartbeat circuit.

16. The system of claim 15 wherein the isolated voltage source is supplied by a programmable logic circuit (PLC) and wherein the logic circuit is implemented by the programmable logic circuit (PLC).

17. The system of claim 15 further comprising a plurality of LEDs at the housing to indicate presence of a voltage at the first line (L1) line input, presence of a voltage at the second line (L2) line input, presence of voltage at the third line (L3) line input, and presence of voltage at the ground (GND) line input.

18. A method of electrical safety monitoring, comprising:
monitoring line inputs consisting of an L1, an L2, an L3, and a GND three-phase connections with an analog circuit, the analog circuit configured to monitor if voltage exists between any two of the line inputs;

controlling a plurality of LEDs to indicate to indicate presence of a voltage at the first line (L1) line input, presence of a voltage at the second line (L2) line input, presence of voltage at the third line (L3) line input, and presence of voltage at the ground (GND) line input;

generating a heartbeat signal indicative of voltage present on any of the line inputs using a heartbeat circuit, wherein the heartbeat circuit is electrically connected to an isolated voltage source to power the heartbeat circuit with a VDC+ and a VDC−;

monitoring the heartbeat signal and decoding the heartbeat signal to provide status of the three-phase connections and detect interruptions between the isolated voltage source and the heartbeat circuit.

* * * * *